(12) United States Patent
Park et al.

(10) Patent No.: US 9,570,304 B2
(45) Date of Patent: Feb. 14, 2017

(54) METHOD OF FORMING FINE PATTERNS IN AN ANTI-REFLECTION LAYER FOR USE AS A PATTERNING HARD MASK

(71) Applicant: Samsung Electronics Co., Ltd., Suwon-si, Gyeonggi-do (KR)

(72) Inventors: Min Ju Park, Seoul (KR); Haisub Na, Seoul (KR); Hyojin Yun, Suwon-si (KR); Kyoungseon Kim, Suwon-si (KR); Su Min Kim, Suwon-si (KR); Hyunwoo Kim, Seongnam-si (KR); Su-min Park, Ansan-si (KR); So-Ra Han, Bucheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/965,255

(22) Filed: Dec. 10, 2015

(65) Prior Publication Data

US 2016/0293417 A1    Oct. 6, 2016

(30) Foreign Application Priority Data

Mar. 31, 2015    (KR) .................... 10-2015-0045423

(51) Int. Cl.
*H01L 21/033* (2006.01)
*H01L 21/027* (2006.01)

(52) U.S. Cl.
CPC ....... *H01L 21/0337* (2013.01); *H01L 21/0276* (2013.01); *H01L 21/0332* (2013.01); *H01L 21/0338* (2013.01)

(58) Field of Classification Search
CPC ............. H01L 21/0337; H01L 21/0276; H01L 21/0332

See application file for complete search history.

(56) References Cited

U.S. PATENT DOCUMENTS

| 7,566,525 | B2 | 7/2009 | Lin et al. |
| 7,892,981 | B2 | 2/2011 | Jung |
| 7,959,818 | B2 | 6/2011 | Jung |
| 8,263,315 | B2 | 9/2012 | Konno |
| 8,663,906 | B2 | 3/2014 | Dammel et al. |
| 8,889,561 | B2 | 11/2014 | Woo et al. |
| 2004/0009436 | A1 | 1/2004 | Lee et al. |

(Continued)

FOREIGN PATENT DOCUMENTS

| JP | H08-31720 A | 2/1996 |
| JP | 5184460 B2 | 4/2013 |

(Continued)

*Primary Examiner* — Charles Garber
*Assistant Examiner* — Brigitte Paterson
(74) *Attorney, Agent, or Firm* — Harness, Dickey & Pierce, P.L.C.

(57) ABSTRACT

Provided is a method of fabricating a semiconductor device. The method includes forming an anti-reflection layer on a lower layer, forming photoresist patterns on the anti-reflection layer, forming protection patterns to cover the photoresist patterns, respectively, etching the anti-reflection layer using the photoresist patterns covered with the protection patterns as an etch mask to form anti-reflection patterns, forming spacers to cover sidewalls of the anti-reflection patterns, and removing the anti-reflection patterns.

19 Claims, 5 Drawing Sheets

(56) References Cited

U.S. PATENT DOCUMENTS

| | | | | |
|---|---|---|---|---|
| 2007/0048670 A1* | 3/2007 | Choi | ........................ | G03F 7/40 |
| | | | | 430/311 |
| 2008/0090350 A1* | 4/2008 | Yan | ..................... | H01L 27/105 |
| | | | | 438/257 |
| 2009/0311635 A1* | 12/2009 | Chen | ...................... | G03F 7/091 |
| | | | | 430/323 |
| 2011/0223542 A1* | 9/2011 | Kendall | ............ | A61M 37/0015 |
| | | | | 430/320 |
| 2015/0270144 A1* | 9/2015 | Chou | ............... | H01L 21/32139 |
| | | | | 257/741 |

FOREIGN PATENT DOCUMENTS

| | | |
|---|---|---|
| JP | 5663140 B2 | 2/2015 |
| KR | 2003-0048216 A | 6/2003 |
| KR | 2007-0051196 A | 5/2007 |
| KR | 2009-0102218 A | 9/2009 |

* cited by examiner

METHOD OF FORMING FINE PATTERNS IN AN ANTI-REFLECTION LAYER FOR USE AS A PATTERNING HARD MASK

CROSS-REFERENCE TO RELATED APPLICATIONS

This U.S. non-provisional patent application claims priority under 35 U.S.C. §119 to Korean Patent Application No. 10-2015-0045423, filed on Mar. 31, 2015, in the Korean Intellectual Property Office, the entire contents of which are hereby incorporated by reference.

BACKGROUND

Example embodiments of the inventive concepts relate to a method of fabricating a semiconductor device, and in particular, to a method of fabricating a semiconductor device using a double patterning technology.

In order to realize a highly-integrated semiconductor device, it is necessary to have a method of forming fine patterns. For example, to integrate more and more devices per a given area, a size of each pattern should be as small as possible. In other words, patterns should be formed in such a way that a pitch thereof is reduced. Due to the recent drastic reduction in the design rule of the semiconductor device, it becomes more and more difficult to form fine patterns with a desired small pitch by only using a photolithography technology with a specific resolution limitation.

SUMMARY

Example embodiments of the inventive concepts provide a simple method of fabricating a semiconductor device with a high integration density.

According to example embodiments of the inventive concepts, a method of fabricating a semiconductor device may include forming an anti-reflection layer on a lower layer, forming photoresist patterns on the anti-reflection layer, forming protection patterns to cover the photoresist patterns, respectively, etching the anti-reflection layer using the photoresist patterns covered with the protection patterns as an etch mask to form anti-reflection patterns, forming spacers to cover sidewalls of the anti-reflection patterns, and removing the anti-reflection patterns.

In example embodiments, the forming of the protection patterns may include forming a protection layer on the anti-reflection layer to cover the photoresist patterns, chemically bonding a portion of the protection layer to exposed surfaces of the photoresist patterns to form protection patterns at an interface between the photoresist patterns and the protection layer, and removing a remaining portion of the protection layer other than the protection patterns.

In example embodiments, the anti-reflection layer may be formed of at least one of materials that are not chemically bonded with the protection layer.

In example embodiments, the anti-reflection layer may be made of cross-linked molecules.

In example embodiments, the protection patterns may be formed to cover top and side surfaces of the photoresist patterns and expose the anti-reflection layer between the photoresist patterns.

In example embodiments, the etching of the anti-reflection layer may be performed in such a way that an etch rate of the protection patterns is lower than that of the anti-reflection layer.

In example embodiments, the protection patterns may be formed of a silicon-containing material.

In example embodiments, at least one of the photoresist patterns and the anti-reflection layer may be formed of a material containing a carbon organic compound.

In example embodiments, the anti-reflection patterns may be formed to have a thickness of 80 nm or larger.

In example embodiments, the anti-reflection patterns may be formed to have a thickness larger than two times a width thereof.

In example embodiments, the anti-reflection patterns may be formed to have a thickness larger than that of the photoresist patterns.

In example embodiments, the forming of the spacers may include forming a preliminary spacer layer to conformally cover the anti-reflection patterns and anisotropically etching the preliminary spacer layer to expose top surfaces of the anti-reflection patterns and a top surface of the lower layer.

In example embodiments, a space between the spacers may be smaller than that between the photoresist patterns.

In example embodiments, the method may further include etching the lower layer using the spacers as an etch mask.

In example embodiments, the method may further include removing the protection patterns and the photoresist patterns, before the forming of the spacers.

According to other example embodiments of the inventive concepts, a method of fabricating a semiconductor device may include forming an anti-reflection layer on a lower layer, forming photoresist patterns on the anti-reflection layer, forming a protection layer to cover the photoresist patterns, chemically bonding a portion of the protection layer with the photoresist patterns at an interface therebetween to form protection patterns, removing a remaining portion of the protection layer other than the protection patterns, etching the anti-reflection layer using the photoresist patterns covered with the protection patterns as an etch mask to form anti-reflection patterns, forming spacers to cover sidewalls of the anti-reflection patterns, and removing the anti-reflection patterns. The protection patterns may be formed of a silicon-containing material.

In example embodiments, the protection patterns may be formed to have a silicon content ranging from 20 wt % to 40 wt %.

In example embodiments, the anti-reflection layer may be formed of a material containing a carbon organic compound.

In example embodiments, the anti-reflection layer may be made of cross-linked molecules.

In example embodiments, the forming of the protection patterns may include performing at least one of exposure and thermal-treatment steps on the photoresist patterns and the protection layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
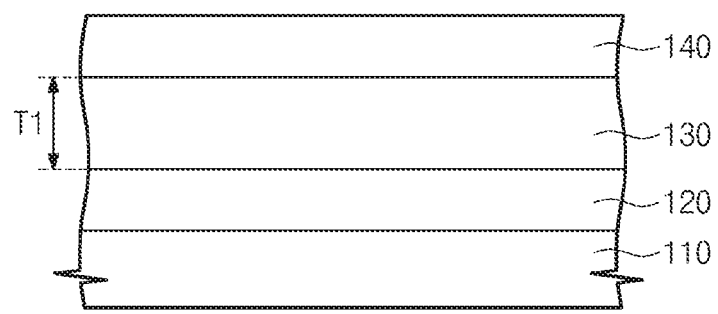
FIGS. 1 through 10 are sectional views illustrating a method of fabricating a semiconductor device, according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these example embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 10 are sectional views illustrating a method of fabricating a semiconductor device, according to example embodiments of the inventive concepts.

Referring to FIG. 1, a lower layer 120, an anti-reflection layer 130, and a photoresist layer 140 may be sequentially stacked on a substrate 110.

The substrate 110 may be a semiconductor substrate, a glass substrate, or a polymer substrate. In the case where the substrate 110 is a semiconductor substrate, the substrate 110 may include at least one of, for example, a crystalline silicon layer, an amorphous silicon layer, a doped silicon layer, or a silicon-germanium layer.

The lower layer 120 may be formed on the substrate 110. The lower layer 120 may include a semiconductor material, a conductive material, or an insulating material. As an example, if the lower layer 120 includes a semiconductor material, the lower layer 120 may be or include a semiconductor substrate or a semiconductor epitaxial layer. As other example, if the lower layer 120 includes a conductive material, the lower layer 120 may be formed of or include at least one of doped poly silicon, metal silicide materials, metallic materials, metal nitride materials, or combinations thereof. As still other example, if the lower layer 120 includes an insulating material, the lower layer 120 may be formed of or include at least one of silicon oxide, silicon nitride, or silicon oxynitride. The lower layer 120 may be a single layer or be a multi-layered structure including a plurality of layers. For example, the lower layer 120 may include a plurality of stacked insulating layers and, in certain cases, the lower layer 120 may further include a conductive or semiconductor layer interposed between the stacked insulating layers. The lower layer 120 may be formed by, for example, a chemical vapor deposition (CVD) process, a physical vapor deposition (PVD) process, or an atomic layer deposition (ALD) process.

The anti-reflection layer 130 may be formed on the lower layer 120. The anti-reflection layer 130 may suppress reflection of incident light propagating toward the lower layer 120 in a subsequent photolithography process, and thus, this may make it possible to prevent or reduce deterioration in critical dimension (CD) uniformity of photoresist patterns (e.g., 145 of FIG. 2). For examples, the formation of the anti-reflection layer 130 may include spin coating an anti-reflection composition on the lower layer 120 and thermally treating the coated anti-reflection composition on the lower layer 120. During the thermal treatment process, molecules included in the anti-reflection layer 130 may form cross-linked bonds, and thus, reactivity of the anti-reflection layer 130 may be lowered. For example, the anti-reflection layer 130 may contain a carbon organic compound. As an example, the anti-reflection layer 130 may include at least one of polyester-based polymers.

The photoresist layer 140 may be formed on the anti-reflection layer 130. The photoresist layer 140 may be formed by, for example, a spin coating process and may include a photo-sensitive carbon organic compound. As an example, the photoresist layer 140 may be formed of or include a polyacrylate resin.

Figure 2:
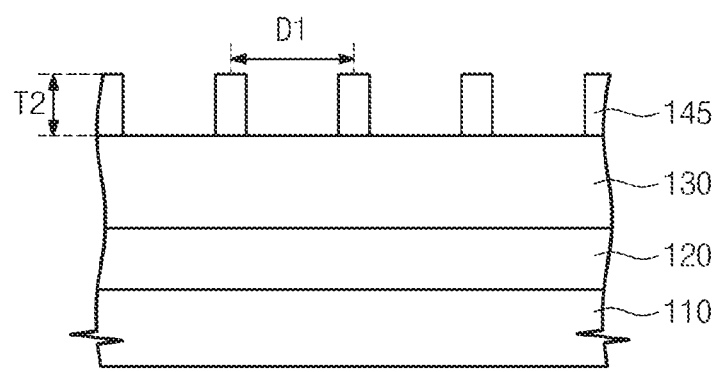

Referring to FIG. 2, a photolithography process may be performed on the photoresist layer 140 to form photoresist patterns 145. The photoresist patterns 145 may be formed to expose a top surface of the anti-reflection layer 130. The photolithography process may include exposure and developing steps. The exposure step may be performed using, for example, krypton fluoride (KrF) laser, argon fluoride (ArF) laser, fluorine ($F_2$) laser, or extreme ultraviolet (EUV) light. A space D1 between the photoresist patterns 145 may be determined by a minimum feature size that can be achieved by the photolithography process. A thickness T2 of the photoresist patterns 145 may be less than a thickness of the anti-reflection layer 130. For example, the photoresist patterns 145 may have an aspect ratio of 1.5:1 or less.

Figure 3:
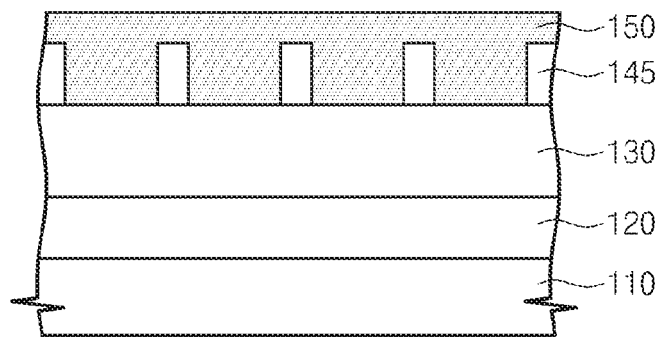

Referring to FIG. 3, a protection layer 150 may be formed to cover the photoresist patterns 145. For example, the protection layer 150 may cover the photoresist patterns 145 and the anti-reflection layer 130 exposed between the photoresist patterns 145. The protection layer 150 may contain silicon (Si), and in particular, the protection layer 150 may be formed to contain a silicon (Si) content ranging from 20 wt % to 40 wt %, with respect to a total weight of the protection layer 150. The protection layer 150 may be formed by a spin coating method.

Figure 4:
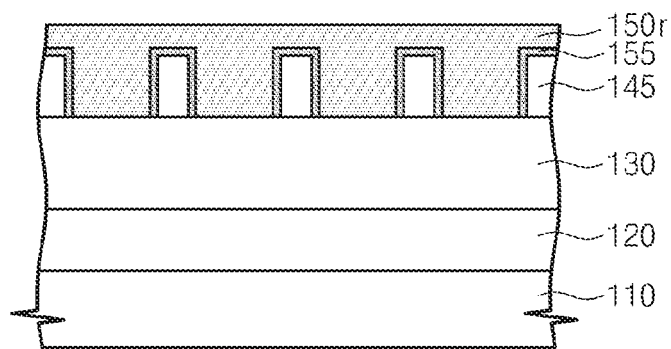

Referring to FIG. 4, protection patterns 155 may be formed to cover the photoresist patterns 145, respectively. The formation of the protection patterns 155 may include performing an exposure step and/or a thermal-treatment step on the structure of FIG. 3. As an example, the formation of the protection patterns 155 may include thermally treating the structure of FIG. 3 at a temperature ranging from 90° C. to 110°C. for t 40-80 seconds. As a result of the exposure and/or thermal-treatment step, chemical bonds may be formed at an interface between the photoresist patterns 145 and the protection layer 150. Accordingly, the protection patterns 155 may be formed to cover top and side surfaces of the photoresist patterns 145. The protection patterns 155 may not be formed between the anti-reflection layer 130 and the protection layer 150. This is because cross-linked bonds, which are formed between molecules constituting the anti-reflection layer 130, may prevent or reduce chemical bonds from being produced at the interface between the anti-reflection layer 130 and the protection layer 150. A portion (hereinafter, a remaining protection layer 150r) of the protection layer 150, which is not chemically bonded with the photoresist patterns 145, may cover the protection patterns 155.

Figure 5:
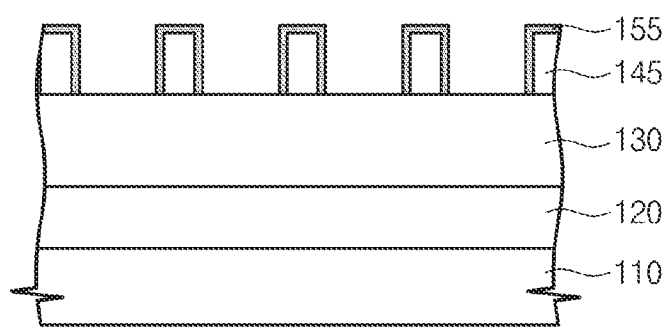

Referring to FIG. 5, the remaining protection layer 150r may be removed. As a result of the removal of the remaining protection layer 150r, the anti-reflection layer 130 may be exposed between the protection patterns 155 or between the photoresist patterns 145. The removal of the remaining protection layer 150r may be performed by, for example, a rinse process using n-butyl acetate solution.

Figure 6:
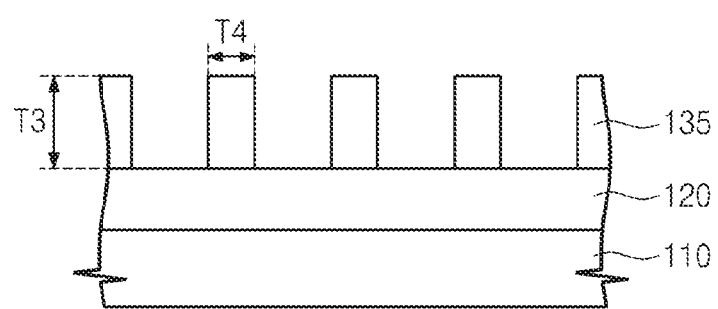

Referring to FIG. 6, the anti-reflection layer 130 may be patterned to form anti-reflection patterns 135. The formation of the anti-reflection patterns 135 may include etching the anti-reflection layer 130 using the photoresist patterns 145 covered with the protection patterns 155 as an etch mask. During the etching process of the anti-reflection layer 130, an etch rate of the protection patterns 155 may be lower than that of the anti-reflection layer 130. As an example, by using $O_2/N_2$-based etching gas to etch the anti-reflection layer 130, it is possible for the protection patterns 155 to have an etch rate lower than that of the anti-reflection layer 130. As described above, the anti-reflection layer 130 may contain a carbon organic compound and the protection patterns 155 may contain silicon (Si) ranging from 20 wt % to 40 wt %, and this may lead to the above difference in etch rate between the protection patterns 155 and the anti-reflection layer 130. After the etching of the anti-reflection layer 130, the photoresist patterns 145 and the protection patterns 155 may be removed. For example, the photoresist patterns 145 and the protection patterns 155 may be removed by a dry etching process using CFx-based gas. In example embodiments, the etching process using the $O_2/N_2$-based etching gas may be performed to remove a portion of the anti-reflection layer 130 exposed between the photoresist patterns 145 and remain the other portion of the anti-reflection layer 130 exposed between the photoresist patterns 145. Thereafter, an etching process using the CFx-based gas may be performed to remove the remaining portion of the anti-reflection layer 130 exposed between the photoresist patterns 145, and as a result, the anti-reflection patterns 135 may be formed. The anti-reflection patterns 135 may have a thickness T3 which is greater than the thickness T2 (e.g., shown in FIG. 2) of the photoresist patterns 145. For example, the thickness T3 of the anti-reflection patterns 135 may range from 80 nm to 120 nm. Furthermore, the anti-reflection patterns 135 may be formed to have an aspect ratio of 2:1 or higher. In other words, the thickness T3 of the anti-reflection pattern 135 may be greater than two times the width T4 of the anti-reflection pattern 135.

Figure 7:
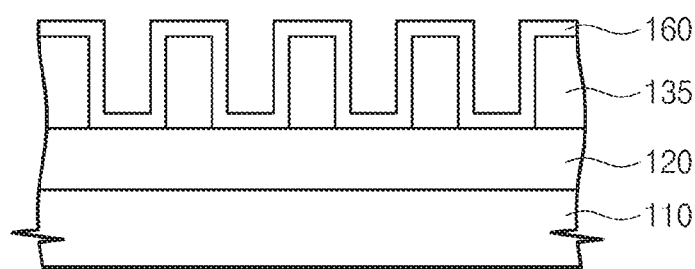

Referring to FIG. 7, a preliminary spacer layer 160 may be formed on the lower layer 120 to conformally cover the anti-reflection patterns 135. The preliminary spacer layer 160 may be formed of a material having an etch selectivity with respect to the anti-reflection patterns 135. For example, the material for the preliminary spacer layer 160 may have an etch rate different from that of the anti-reflection patterns 135. As an example, the preliminary spacer layer 160 may be formed of or include silicon oxide. The preliminary spacer layer 160 may be formed by, for example, an atomic layer deposition (ALD) process.

Figure 8:
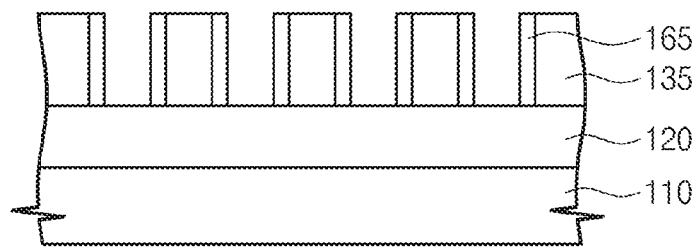

Referring to FIG. 8, the preliminary spacer layer 160 may be anisotropically etched to form spacers 165. The anisotropic etching of the preliminary spacer layer 160 may be performed to expose top surfaces of the lower layer 120 and the anti-reflection patterns 135. Accordingly, the spacers 165 may be formed to cover sidewalls of the anti-reflection patterns 135 and expose the top surface of the lower layer 120 between the anti-reflection patterns 135.

Figure 9:
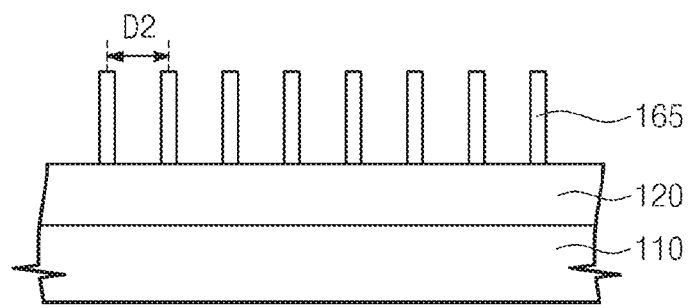

Referring to FIG. 9, the anti-reflection patterns 135 may be removed. The removal of the anti-reflection patterns 135 may be performed by, for example, an ashing process and/or a strip process. Accordingly, the top surface of the lower layer 120 may be exposed between the spacers 165. A space D2 between the spacers 165 may be smaller than the space (e.g., D1 shown in FIG. 2) between the photoresist patterns 145.

Figure 10:
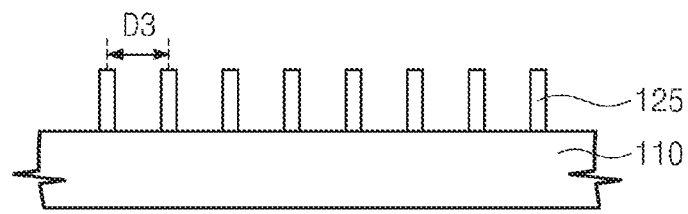

Referring to FIG. 10, the lower layer 120 may be etched using the spacers 165 as an etch mask to form lower fine patterns 125. A space D3 between the lower fine patterns 125 may be smaller than the space (e.g., D1 shown in FIG. 2) between the photoresist patterns 145. For example, the space D3 between the lower fine patterns 125 may be smaller than a minimum feature size that can be achieved by the photolithography process. The spacers 165 may be removed, after the formation of the lower fine patterns 125.

In general, due to a likelihood of photoresist pattern collapse, it is hard to form photoresist patterns having a large thickness or a high aspect ratio. Also, since both the photoresist patterns and the anti-reflection layer are formed of carbon organic compounds, it is difficult to achieve a high etch selectivity between the photoresist patterns and the anti-reflection layer. Accordingly, when only the photoresist patterns are used as an etch mask for etching the anti-reflection layer, it is hard to form anti-reflection patterns with a large thickness or a high aspect ratio. In the case of a self-aligned double patterning process, if the anti-reflection patterns are formed to have a low aspect ratio, they may be hardly used as a mandrel for forming a spacer. Accordingly, in the conventional self-aligned double patterning process, it is necessary to form a silicon hard mask layer and a carbon hard mask layer below the anti-reflection layer, so as to form a mandrel with a high aspect ratio.

By contrast, in the method of fabricating a semiconductor device according to example embodiments of the inventive concepts, the protection patterns (e.g., 155 of FIG. 5) covering the photoresist patterns (e.g., 145 of FIG. 5) may be formed to have a high etch selectivity, during the etching process for patterning the anti-reflection layer (e.g., 130 of FIG. 5). Accordingly, the anti-reflection patterns (e.g., 135 of FIG. 6) may be formed to have a large thickness (e.g., 80 nm or thicker) and a high aspect ratio (e.g., 2:1 or higher). As a result, the anti-reflection patterns (e.g., 135 of FIG. 8) may be used as the mandrel for forming the spacer (165 of FIG. 8) in the self-aligned double patterning process, and additional steps for forming the silicon and carbon hardmask layers may be omitted. In other words, it is possible to prevent or reduce fabrication cost for fine patterns.

According to example embodiments of the inventive concepts, a method of fabricating a semiconductor device may include using spacers, which are formed on sidewalls of anti-reflection patterns, as an etch mask to form lower fine patterns. This makes it possible to fabricate a semiconductor device in prevented or reduced fabrication cost and time.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming an anti-reflection layer on a lower layer;
    forming photoresist patterns on the anti-reflection layer;
    forming protection patterns to cover the photoresist patterns, respectively;
    etching the anti-reflection layer using the photoresist patterns covered with the protection patterns as an etch mask to form anti-reflection patterns;
    forming spacers to cover sidewalls of the anti-reflection patterns, the forming the spacers including,
        forming a preliminary spacer layer to conformally cover the anti-reflection patterns, and
        anisotropically etching the preliminary spacer layer to expose top surfaces of the anti-reflection patterns and a top surface of the lower layer; and
    removing the anti-reflection patterns.

2. The method of claim 1, wherein the forming of the protection patterns comprises:
    forming a protection layer on the anti-reflection layer to cover the photoresist patterns;
    chemically bonding a portion of the protection layer to exposed surfaces of the photoresist patterns to form protection patterns at an interface between the photoresist patterns and the protection layer; and
    removing a remaining portion of the protection layer other than the protection patterns.

3. The method of claim 2, wherein the anti-reflection layer is formed of at least one of materials that are not chemically bonded with the protection layer.

4. The method of claim 1, wherein the anti-reflection layer is made of cross-linked molecules.

5. The method of claim 1, wherein the forming of the protection patterns includes forming the protection patterns to cover top and side surfaces of the photoresist patterns and expose the anti-reflection layer between the photoresist patterns.

6. The method of claim 1, wherein the etching of the anti-reflection layer is performed in such a way that an etch rate of the protection patterns is lower than that of the anti-reflection layer.

7. The method of claim 1, wherein the protection patterns are formed of a silicon-containing material.

8. The method of claim 7, wherein the photoresist patterns and the anti-reflection layer are formed of a material containing a carbon organic compound.

9. The method of claim 1, wherein the anti-reflection patterns are formed to have a thickness ranging from 80 nm to 120 nm.

10. The method of claim 1, wherein the anti-reflection patterns are formed to have a thickness larger than two times a width thereof.

11. The method of claim 1, wherein the anti-reflection patterns are formed to have a thickness larger than that of the photoresist patterns.

12. The method of claim 1, wherein a space between the spacers is smaller than that between the photoresist patterns.

13. The method of claim 1, further comprising:
    etching the lower layer using the spacers as an etch mask.

14. The method of claim 1, further comprising:
    removing the protection patterns and the photoresist patterns, before the forming of the spacers.

15. A method of fabricating a semiconductor device, comprising:
    forming an anti-reflection layer on a lower layer;
    forming photoresist patterns on the anti-reflection layer;
    forming a protection layer to cover the photoresist patterns;
    chemically bonding a portion of the protection layer with the photoresist patterns at an interface therebetween to form protection patterns;
    removing a remaining portion of the protection layer other than the protection patterns;
    etching the anti-reflection layer using the photoresist patterns covered with the protection patterns as an etch mask to form anti-reflection patterns;
    forming spacers to cover sidewalls of the anti-reflection patterns, the forming the spacers including,
        forming a preliminary spacer layer to conformally cover the anti-reflection patterns, and
        anisotropically etching the preliminary spacer layer to expose top surfaces of the anti-reflection patterns and a top surface of the lower layer; and
    removing the anti-reflection patterns, wherein the protection patterns are formed of a silicon-containing material.

16. The method of claim 15, wherein the protection patterns are formed to have a silicon content ranging from 20 wt % to 40 wt %.

17. The method of claim 15, wherein the anti-reflection layer is formed of a material containing a carbon organic compound.

18. The method of claim 15, wherein the anti-reflection layer is made of cross-linked molecules.

19. The method of claim 15, wherein the forming of the protection patterns includes performing at least one of exposure and thermal-treatment steps on the photoresist patterns and the protection layer.

\* \* \* \* \*